(12) United States Patent
Hirosaki

(10) Patent No.: US 10,662,374 B2
(45) Date of Patent: *May 26, 2020

(54) PHOSPHOR, PRODUCTION METHOD FOR SAME, ILLUMINATION INSTRUMENT, AND IMAGE DISPLAY DEVICE

(71) Applicant: National Institute for Materials Science, Ibaraki (JP)

(72) Inventor: Naoto Hirosaki, Ibaraki (JP)

(73) Assignee: National Institute for Materials Science, Tsukuba-shi (JP)

( * ) Notice: Subject to any disclaimer, the term of this patent is extended or adjusted under 35 U.S.C. 154(b) by 367 days.

This patent is subject to a terminal disclaimer.

(21) Appl. No.: 15/574,143

(22) PCT Filed: May 13, 2016

(86) PCT No.: PCT/JP2016/064385
§ 371 (c)(1),
(2) Date: Nov. 14, 2017

(87) PCT Pub. No.: WO2016/186057
PCT Pub. Date: Nov. 24, 2016

(65) Prior Publication Data
US 2018/0127648 A1    May 10, 2018

(30) Foreign Application Priority Data
May 15, 2015 (JP) .................. 2015-100444

(51) Int. Cl.
*C09K 11/64*    (2006.01)
*F21V 9/30*    (2018.01)
(Continued)

(52) U.S. Cl.
CPC ............ *C09K 11/643* (2013.01); *C09K 11/08* (2013.01); *C09K 11/0883* (2013.01);
(Continued)

(58) Field of Classification Search
CPC ........................ C09K 11/643; C09K 11/676
See application file for complete search history.

(56) References Cited

U.S. PATENT DOCUMENTS

2009/0121608 A1    5/2009    Nims
2011/0149550 A1    1/2011    Jermann

FOREIGN PATENT DOCUMENTS

JP    2009-96854 A    5/2009

OTHER PUBLICATIONS

H. X. Willem, et al., "Neutron Diffraction of y-aluminium oxynitride," Journal of Materials Sciences Letters, vol. 12, pp. 1470-1472 (1993).

(Continued)

*Primary Examiner* — C Melissa Koslow
(74) *Attorney, Agent, or Firm* — Trojan Law Offices

(57) ABSTRACT

Provided are a phosphor, a manufacture thereof, and an illuminating device and an image display device using same which has excellent blue excitation characteristics of at least 440 nm and not exceeding 449 nm. The phosphor of the present invention includes an inorganic compound in which an AlON crystal, an AlON solid solution crystal, or an inorganic crystal having a same crystal structure as AlON, includes at least Mn and an A element (where the A element is a monovalent metal element) and, if necessary, a D element (where the D element is an element other than Mn, the A element, Al, O, and N) wherein, upon irradiation of an excitation source, the phosphor emits fluorescence having a peak wavelength in a range of at least 490 nm and not exceeding 550 nm.

21 Claims, 2 Drawing Sheets

(51) Int. Cl.
*C09K 11/08* (2006.01)
*H01L 33/50* (2010.01)
*C09K 11/61* (2006.01)
*H01L 33/56* (2010.01)
*H01L 33/48* (2010.01)
*H01L 33/54* (2010.01)
*H01L 33/62* (2010.01)

(52) U.S. Cl.
CPC .............. *C09K 11/61* (2013.01); *C09K 11/64* (2013.01); *F21V 9/30* (2018.02); *H01L 33/50* (2013.01); *H01L 33/502* (2013.01); *H01L 33/507* (2013.01); *H01L 33/56* (2013.01); *H01L 33/486* (2013.01); *H01L 33/54* (2013.01); *H01L 33/62* (2013.01)

(56) References Cited

OTHER PUBLICATIONS

ICSD No. 70032; ICSD (Inorganic crystal structure database) (published by Fachinformationszentrum Karlsruhe, Germany).

PHOSPHOR, PRODUCTION METHOD FOR SAME, ILLUMINATION INSTRUMENT, AND IMAGE DISPLAY DEVICE

TECHNICAL FIELD

The present invention relates to a phosphor having, as a host crystal, an AlON (aluminum oxynitride) crystal, an AlON solid solution crystal, or an inorganic crystal having a crystal structure identical to that of the AlON crystal, a manufacturing method thereof, and an application thereof. In detail, it relates to the phosphor that emits light having a peak at a wavelength in a range of 490 nm or longer and 550 nm or shorter and includes, as a host crystal, the above-mentioned AlON (aluminum oxynitride) crystal, the AlON solid solution crystal, or the inorganic crystal having the crystal structure identical to that of the AlON crystal; a manufacturing method thereof; and an illumination instrument (or illuminating device) and an image display device that utilize the phosphor.

BACKGROUND ART

The phosphor is utilized in a fluorescent display tube (VFD: Vacuum-Fluorescent Display), a field emission display (FED: Field Emission Display or SED: Surface-Conduction Electron-Emitter Display), a plasma display panel (PDP: Plasma Display Panel), a cathode-ray tube (CRT: Cathode-Ray Tube), a liquid-crystal display backlight (Liquid-Crystal Display Backlight), a white light-emitting diode (LED: Light-Emitting Diode), and so on. In any of these applications, it is necessary to provide the phosphor with energy to excite the phosphor in order to make the phosphor emit fluorescence and the phosphor is excited by an excitation source with high energy such as a vacuum ultraviolet ray, an ultraviolet ray, an electron beam, and blue light so as to emit a visible light ray such as blue light, green light, yellow light, orange light, and red light. However, as a result of the phosphor being exposed to such excitation source, the luminance of the phosphor tends to decrease and a phosphor having little degradation in the brightness is desired. Therefore, a phosphor having an inorganic crystal containing nitrogen in a crystal structure thereof as a host crystal, instead a conventional phosphor such as a silicate phosphor, a phosphate phosphor, a aluminate phosphor, and a sulfide phosphor, has been proposed, as exemplified by a sialon phosphor, an oxynitride phosphor, or a nitride phosphor, which is characterized by low brightness deterioration caused by high energy excitation.

As one example of such an oxynitride phosphor, a phosphor in which an AlON crystal is activated by Mn is known (for example, refer to Patent Reference 1). This phosphor emits green light with high color purity having a peak from 510 to 520 nm and a narrow half width of the spectrum when it is excited by an ultraviolet ray, blue light, or an electron beam. Therefore, it is suitable as a green phosphor for the image display device.

Further, if Mg is added to the AlON crystal, it is reported that excitation characteristics by blue light of 440 nm to 460 nm may be improved (for example, refer to Patent Reference 2).

However, even though a phosphor in which the AlON crystal was activated by Mn exhibited high color purity of green, it could not be said that the excitation characteristics by blue light of 440 nm to 449 nm (also referred to as "blue light excitation characteristics") were sufficient. Although the blue light excitation characteristics were improved when Mg was added to the AlON crystal, further improvement of the emission intensity was also in demand.

PRIOR ART REFERENCES

Patent References

[Patent Reference 1] International Publication No. WO 2007/099862
[Patent Reference 2] Japanese Patent No. 5224439

Non-Patent Reference

[Non-Patent Reference 1]
H. X. Willem, et al., "Newtron diffraction of γ-aluminium oxynitride," Journal of materials science letters, vol. 12, pp. 1470-1472 (1993).
[Non-Patent Reference 2]
ICSD No. 70032; ICSD (Inorganic crystal structure database) (published by Fachinformationszentrum Karlsruhe, Germany).

SUMMARY OF THE INVENTION

Problem to be Solved by the Invention

The present invention has been made to respond to such demands, and it is an object of the present invention to provide a phosphor that has excellent emission characteristics compared with a conventional AlON phosphor, especially excellent blue light excitation characteristics of 440 nm or longer and 449 nm or shorter, a method for manufacturing the phosphor, and an illuminating device and an image display device using the phosphor. In detail, it is an object of the present invention to provide a phosphor that emits green light with high color purity having a peak at a wavelength in a range of 490 nm or longer and 550 nm or shorter, a method of manufacturing the phosphor, and an illuminating device and an image display device utilizing the phosphor.

Means to Solve the Problem

The inventor has found that, under such circumstances, a phosphor is configured to include an inorganic compound as a main component in which an AlON crystal, an AlON solid solution crystal, or an inorganic crystal having a crystal structure identical to the AlON crystal contains at least Mn and an A element (where the A element is a monovalent metal), and further contains a D element if necessary (where the D element is an element other than Mn, the A element, Al, O, and N), whereby the blue light excitation characteristics of 440 nm or longer and 449 nm or shorter may be improved. In particular, it has been found that an inorganic compound having a specific composition range and including Mn and Li as the A element may become a phosphor that emits green light with high color purity and exhibits a high emission efficiency upon a blue light excitation such that the phosphor is suitable for an illuminating device and an image display device.

As a result of further intensive investigations on the basis of this discovery, a phosphor that shows a luminous phenomenon with high intensity in a specific wavelength range; a method for manufacturing the phosphor; and an illuminating device and an image display device having excellent properties have been successfully provided. The following describes each of them more specifically.

A phosphor of the present invention includes an inorganic compound in which an AlON crystal, an AlON solid solution crystal, or an inorganic crystal having a crystal structure identical to the AlON crystal includes at least Mn and an A element (where the A element is a monovalent metal element); and further includes a D element (where the D element is an element other than Mn, the A element, Al, O, and N) if necessary, and the phosphor emits fluorescence having a peak at a wavelength in a range of 490 nm or longer and 550 nm or shorter upon irradiation of the excitation source.

The Mn and the A element, and the D element if necessary, may be solid-solved into the AlON crystal, the AlON solid solution crystal, or the inorganic crystal having a crystal structure identical to the AlON crystal.

The phosphor is represented by a composition formula: $Mn_aA_bAl_cO_dN_eD_f$ (where $a+b+c+d+e+f=1$ in the formula), and the parameters a, b, c, d, e, and f may satisfy the following condition:

$0.0003 \leq a \leq 0.10$, $0.002 \leq b \leq 0.24$, $0.25 \leq c \leq 0.45$, $0.42 \leq d \leq 0.58$, $0.02 \leq e \leq 0.13$, and $0 \leq f \leq 0.10$.

The parameters a, b, c, d, e, and f may satisfy the following condition:

$0.004 \leq a \leq 0.10$, $0.002 \leq b \leq 0.032$, $0.31 \leq c \leq 0.41$, $0.5 \leq d \leq 0.57$, $0.02 \leq e \leq 0.075$, and $0 \leq f \leq 0.02$.

The A element may be Li.
The D element may be Mg.
The D element may be partially or entirely constituted of Mg and a parameter value $f_1$ (atomic fraction) indicating a content of the Mg may satisfy $0.001 \leq f_1 \leq 0.09$.

The D element may be partially or entirely constituted of F and a parameter value $f_2$ (atomic fraction) indicating a content of the F may satisfy $0.0001 \leq f_2 \leq 0.05$.

Upon irradiation of the excitation light having a wavelength of 430 nm or longer and 460 nm or shorter, fluorescence having a peak at a wavelength in a range of 510 nm or longer and 530 nm or shorter may be emitted.

An illuminating device according to the present invention includes at least an emission source that emits light having a wavelength of 410 nm or longer and 460 nm or shorter and a phosphor or a light transmitting body in which the phosphor is dispersed, and the phosphor includes the above-described phosphor, thereby solving the above-mentioned problem.

The emission source may be an LED (light-emitting diode) or an LD (laser diode) that emits light having a peak at a wavelength in a range of 430 nm or longer and 460 nm or shorter.

The emission source may be an LED (light-emitting diode) or an LD (laser diode) that emits light having a peak at a wavelength in a range of 440 nm or longer and 449 nm or shorter.

The phosphor may further include a red phosphor to emit light having a peak at a wavelength in a range of 620 nm or longer and 670 nm or shorter.

The red phosphor may be a phosphor activated by $Mn^{4+}$.

The above-mentioned red phosphor may be KSF and/or KSNAF.

In the light transmitting body in which the phosphor is dispersed, a proportion of the phosphor in the light transmitting body may be 30 volume % or more and 90 volume % or less.

The light transmitting body may be selected from a group constituted of acrylic resin, silicone resin, and glass.

An image display device according to the present invention includes at least an excitation source and a phosphor, and the phosphor includes the above-described phosphor, thereby solving the above-mentioned problems.

A method for manufacturing a phosphor according to the present invention comprises mixing, at least, $Al_2O_3$, AlN, a raw material containing Mn and another raw material containing an A element (where the A element is a monovalent metal element), and, if necessary, a yet another raw material containing a D element (where the D element is an element other than Mn, the A element, Al, O, and N), and firing thus-mixed materials in a nitrogen atmosphere in a range of 0.2 atm or higher and 100 atm or lower at a temperature in a range of 1500° C. or higher and 2400° C. or lower, thereby solving the above-mentioned problem.

The A element may be Li.
The D element may be a divalent metal element.

Effect of the Invention

A phosphor of the present invention comprises, as a main component, an inorganic compound including an AlON crystal, an AlON solid solution crystal, or an inorganic crystal having a crystal structure identical to the AlON crystal, each of which includes Mn for a metal ion thereof to serve as a luminescence center and an A element of a monovalent metal element, such that green light with high color purity having a peak at a wavelength in a range of 490 nm or longer and 550 nm or shorter may be emitted. A phosphor having a specific composition according to the present invention is excellent in blue light excitation characteristics to emit fluorescence having a peak at a wavelength in a range of 510 nm or longer and 530 nm or shorter upon irradiation of excitation light having a wavelength of 410 nm or longer and 449 nm or shorter. Therefore, the phosphor is a useful phosphor that may be suitably utilized in an LED, an FED, an SED, a CRT, and so on. In particular, the e phosphor is useful for an LED for a backlight of a liquid crystal television and a mobile terminal.

EMBODIMENT FOR CARRYING OUT THE INVENTION

Figure 1:
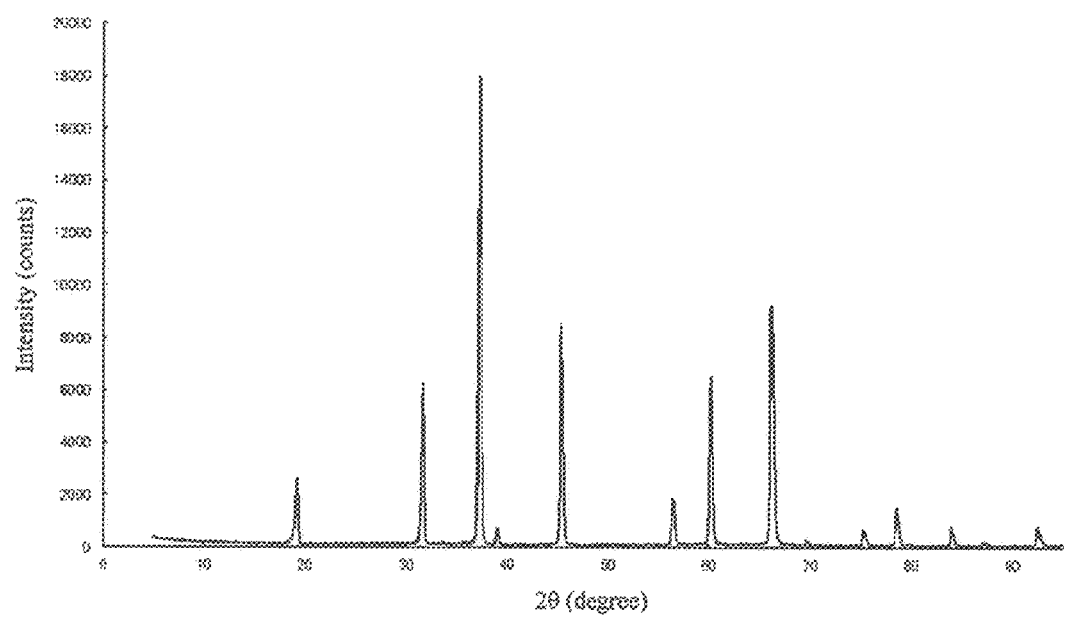
FIG. 1 is a diagram showing an XRD pattern of an inorganic compound of Example 1.

In the following, embodiments of the present invention are described in detail.

A phosphor of the present invention can include an inorganic compound as a main component in which at least Mn and an A element (where the A element is a monovalent metal element) are included into an AlON crystal, an AlON solid solution crystal, or an inorganic crystal having a crystal structure identical to that of the AlON crystal.

The AlON crystal is a crystal having a cubic spinel-type crystal structure and is also called γ-AlON as described in Non-patent documents 1 and 2 (The entire contents of Non-patent References 1 and 2 are incorporated herein by reference.). This crystal is synthesized by mixing AlN and $Al_2O_3$ being added thereto, and firing a mixture thereof at 1850° C.

The AlON solid solution crystal is a crystal in which, while the crystal structure of the AlON crystal is maintained, a ratio of oxygen/nitrogen is changed and/or a crystal to which another element is added. The other element to be added may include silicon, Mg, F, and so on.

The inorganic crystal having the identical crystal structure to that of the AlON crystal is a crystal in which Al, O, and N are partially or completely substituted with other elements while the crystal structure of the AlON crystal is maintained.

In the present invention, the above crystals may be used as host crystals. The AlON crystal or the AlON solid solution crystal can be identified by the X-ray diffraction and the neutron diffraction methods. Details of the crystal structure are described in Non-patent References 1 and 2 and the crystal structure and the X-ray diffraction pattern are unambiguously determined from data such as the lattice constants, the space group, and the atomic positions which are described in the References. Also, in addition to the substance exhibiting the same diffraction pattern as that of the pure AlON crystal or the AlON solid solution crystal, the inorganic crystal having the identical crystal structure to that of the AlON crystal in which the lattice constants are changed by substituting the constituent elements with other elements can be identified and included as part of the present invention.

The phosphor includes, as the main component, the inorganic compound in which Mn, as an optically activating metal element, is included into the AlON crystal, the AlON solid solution crystal, or the inorganic crystal having the identical crystal structure to that of the AlON crystal, thereby allowing it to be a phosphor having green color emission characteristics.

The phosphor of the present invention includes, as the main component, the inorganic compound in which the A element (where the A element is a monovalent metal element) is further included into the AlON crystal, the AlON solid solution crystal, or the inorganic crystal having the identical crystal structure to that of the AlON crystal, in which Mn is included, thereby allowing it to be a phosphor having excellent emission characteristics. The monovalent metal is readily solid-solved into the host crystal such as the AlON crystal. And hence the crystal structure is stabilized such that $Mn^{2+}$ can stably remain in the crystal of the thus-stabilized crystal structure. And these ions get easily incorporated into the crystal. In this way, brightness of the phosphor can be improved. In particular, this effect is great when the A element is Li such that it is preferable that the A element is Li in order to make the emission characteristics improved. If such a phosphor of the present invention is irradiated with the excitation source, fluorescence having a peak at a wavelength in a range of 490 nm or longer and 550 nm or shorter can be emitted.

The phosphor of the present invention includes, as the main component, the inorganic compound in which the D element (where the D element is an element other than Mn, the A element, Al, O, and N) is further included into the AlON crystal, the AlON solid solution crystal, or the inorganic crystal having the identical crystal structure to that of the AlON crystal, in which Mn and the A element (where the A element is a monovalent metal element) are more preferably included, thereby allowing the phosphor to exhibit further excellent emission characteristics. In case the D element is a divalent metal, the divalent metal element is readily solid solved into the host crystal such as the AlON crystal. And hence the crystal structure is stabilized such that $Mn^{2+}$ can stably remain in the crystal of the thus-stabilized crystal structure. And these ions get easily incorporated into the crystal. In this way, brightness of the phosphor can be further improved. In particular, this effect is great when the D element is Mg such that it is preferable that the D element is Mg in order to make the emission characteristics improved.

Preferably, in the phosphor of the present invention, Mn and the A element, and the D element if necessary, are solid solved into the AlON crystal, the AlON solid solution crystal, or the inorganic crystal having the identical crystal structure to that of the AlON crystal. These elements are solid solved into these host crystals, thereby allowing the phosphor to perform emission of high intensity.

Here, differences between Patent References 1 and 2 and the phosphor of the present invention are discussed. According to Patent References 1 and 2, a phosphor having an AlON crystal as a host crystal was reported, but it was not even considered whether the AlON crystal including a monovalent metal, in particular, Li is to be used as the host crystal. That is, it should be noted that only the present inventor for the first time found out that the phosphor including the AlON crystal, the AlON solid solution crystal, or the inorganic crystal having the identical crystal structure to that of the AlON crystal, each of which included a monovalent metal element of the A element, performed a green color emission with high color purity and exhibited excellent blue light excitation characteristics.

It is preferable that the composition range is represented by a composition formula $Mn_aA_bAl_cO_dN_eD_f$ (where it is assumed that $a+b+c+d+e+f=1$ in the formula) and the parameters a, b, c, d, e, and f are selected from values that satisfy all the following condition. Here, the A element is a monovalent metal element and the D element is an element other than Mn, the A element, Al, O, and N.

$0.0003 \leq a \leq 0.10$, $0.002 \leq b \leq 0.24$, $0.25 \leq c \leq 0.45$, $0.42 \leq d \leq 0.58$, $0.02 \leq e \leq 0.13$, and $0 \leq f \leq 0.10$.

The phosphor of the present invention satisfying the above composition condition can emit fluorescence having a peak at a wavelength in a range of 490 nm or longer and 550 nm or shorter upon irradiation of the excitation source.

More preferably, the parameters a, b, c, d, e, and f satisfy:

$0.004 \leq a \leq 0.10$, $0.002 \leq b \leq 0.032$, $0.31 \leq c \leq 0.41$, $0.5 \leq d \leq 0.57$, $0.02 \leq e \leq 0.075$, and $0 \leq f \leq 0.02$.

In this way, the phosphor of the present invention satisfying the above composition condition can emit fluorescence of high intensity having a peak at a wavelength in a range of 510 nm or longer and 530 nm or shorter upon irradiation of the excitation source.

Here, the 'a' represents an additive amount of the metal ion Mn and satisfies $0.0003 \leq a \leq 0.10$. If the parameter 'a' value is less than 0.0003, the emission luminance may be lowered because the number of ions to serve as the center of emission is too low. If the parameter 'a' value is more than 0.10, the emission luminance may be lowered because of the concentration quenching caused by the interference among the ions. More preferably, the 'a' satisfies $0.004 \leq a \leq 0.01$, thereby allowing the emission brightness to be enhanced.

The b represents an amount of the A element (monovalent metal element) and satisfies $0.002 \leq b \leq 0.24$. More preferably, the b satisfies $0.002 \leq b \leq 0.032$. If the b value is in this range, the emission intensity can be enhanced. The A element is Li, Na, K, or the like, but if it is Li, the emission intensity in particular could be enhanced.

The c represents an amount of Al element and satisfies $0.25 \leq c \leq 0.45$. More preferably, the c satisfies $0.31 \leq c \leq 0.41$. If the c value is out of this range, it might occur that a production ratio of crystal phases other than the AlON crystal, the AlON solid solution crystal, or the inorganic crystal having the identical crystal structure to that of the AlON crystal could be increased such that the emission intensity could be lowered.

The d represents an amount of oxygen and satisfies $0.42 \leq d \leq 0.58$. More preferably, the d satisfies $0.5 \leq d \leq 0.57$. If the d value is out of this range, it might occur that a production ratio of crystal phases other than the AlON crystal, the AlON solid solution crystal, or the inorganic crystal having the identical crystal structure to that of the AlON crystal could be increased such that the emission intensity could be lowered.

The e represents an amount of nitrogen and satisfies $0.02 \leq e \leq 0.13$. More preferably, the e satisfies $0.02 \leq e \leq 0.075$. If the e value is out of this range, it might occur that a production ratio of crystal phases other than the AlON crystal, the AlON solid solution crystal, or the inorganic crystal having the identical crystal structure to that of the AlON crystal could be increased such that the emission intensity could be lowered.

The f represents an amount of the element (D element) other than Mn, the A element, Al, O, and N and satisfies $0 \leq f \leq 0.1$. The f value represents an amount of the D element which is contained in or solid solved into the AlON crystal, the AlON solid solution crystal, or the inorganic crystal having the identical crystal structure to that of the AlON crystal such that the amount of the D element contained in the mixture as crystal phases other than the above-described crystals or as an amorphous phase is not counted. Further, fluorine, chlorine, and the like could be included as non-metal ions as the D element to a certain amount as long as the crystal structure of the AlON crystal, the AlON solid solution crystal, or the inorganic crystal having the identical crystal structure to that of the AlON crystal is sustained.

Here, the parameters a, b, c, d, e, and f preferably satisfies:

$0.01 \leq a \leq 0.095$, $0.025 \leq b \leq 0.032$, $0.31 \leq c \leq 0.35$, $0.5 \leq d \leq 0.53$, $0.03 \leq e \leq 0.06$, and $0 \leq f \leq 0.02$.

In this way, the phosphor of the present invention satisfying the above composition condition can emit fluorescence of high intensity having a peak at a wavelength in a range of 515 nm or longer and 530 nm or shorter upon irradiation of the excitation source.

Here, the parameters a, b, c, d, e, and f preferably satisfies:

$0.004 \leq a \leq 0.006$, $0.02 \leq b \leq 0.03$, $0.35 \leq c \leq 0.4$, $0.54 \leq d \leq 0.57$, $0.01 \leq e \leq 0.04$, and $0 \leq f \leq 0.02$.

In this way, the phosphor of the present invention satisfying the above composition condition can emit fluorescence of especially high intensity having a peak at a wavelength in a range of 510 nm or longer and 530 nm or shorter upon irradiation of the excitation source.

As described above, a divalent metal may be included as the D element and, in particular, Mg is included as the D element such that the emission intensity may be high. In particular, in the case where the D element is partially or entirely Mg and a parameter value $f_1$ (atomic fraction) indicating a content of Mg satisfies $0.001 \leq f_1 \leq 0.09$, the emission intensity is high.

Furthermore, fluorine, chlorine, and the like may be included as non-metal ions as long as the crystal structure of the AlON crystal, the AlON solid solution crystal, or the inorganic crystal having the crystal structure identical to that of the AlON crystal is sustained. In particular, in the case where the D element is partially or entirely F and a parameter value $f_2$ (atomic fraction) indicating a content of F satisfies $0.0001 \leq f_2 \leq 0.05$, the emission intensity is high.

Here, in the case where the D element includes two or more kinds of elements, it should be understood that the above-described value f is a sum of the parameter values of the respective elements. For example, in the case where the D element includes Mg and F, the value f is a sum of the value $f_1$ and the value $f_2$.

As the phosphor of the present invention is irradiated by the excitation source, it emits green fluorescence having a peak at a wavelength in a range of wavelength of 490 nm or longer and 550 nm or shorter. It is efficiently excited by an ultraviolet ray, an electron beam, an X-ray, and the like as the excitation source.

In the case where the excitation is caused by the ultraviolet ray and the visible light, it is efficiently excited in particular by the light having a wavelength of 230 nm or longer and 460 nm or shorter. Since the excitation efficiency by the light in particular having a wavelength of 410 nm or longer and 460 nm or shorter, preferably a wavelength of 420 nm or longer and 460 nm or shorter, preferably a wavelength of 430 nm or longer and 460 nm or shorter, more preferably a wavelength of 440 nm or longer and 450 nm or shorter, and yet more preferably a wavelength of 440 nm or longer and 449 nm or shorter, is high and fluorescence of green color having a peak at a wavelength in a range of 510 nm or longer and 530 nm or shorter is emitted, it is suitable for the application of the white or colored LED illumination, in which a light-emitting diode (LED) to emit light in such a range and the phosphor of the present invention are combined.

Furthermore, radiation of the excitation light having the peak at a wavelength in a range of 440 nm or longer and 450 nm or shorter causes fluorescence having a peak at a wavelength in a range of 510 nm or longer and 530 nm or shorter to be emitted. The fluorescence spectrum is a sharp spectrum having a narrow line width and exhibits a green color with high color purity such that the phosphor of the present invention is suitable for a green phosphor used for a backlight LED for the application to a liquid crystal image display element.

The phosphor of the present invention efficiently emits the light especially by the electron beam such that it is suitable for the green phosphor for the application to the image display element of the electron beam excitation such as the CRT and the FED.

In the phosphor of the present invention, in a view point of the fluorescence emission, it is desirable that the inorganic compound includes, as the main component, the AlON crystal, the AlON solid solution crystal, or the inorganic crystal having the crystal structure identical to the AlON crystal, each of which includes at least Mn and the A element in high purity and as much as possible, and, if possible, it is desirable that the inorganic compound is constituted of a single phase thereof, but the inorganic compound may be a mixture with another crystal phase or an amorphous phase to the extent that the properties do not deteriorate. In this case, it is desirable that the content of the AlON crystal, the AlON solid solution crystal, or the inorganic crystal having the crystal structure identical to the AlON crystal, each of which includes at least Mn and the A element, is 10 mass % or more, more preferably 50 mass % or more such that high brightness may be achieved.

Accordingly, in the phosphor of the present invention, the range of the main component of the inorganic compound is that the content of the AlON crystal, the AlON solid solution crystal, or the inorganic crystal having the crystal structure identical to the AlON crystal, each of which includes at least Mn and the A element, is at least 10 mass % or more. The ratio of the content can be obtained by performing an X-ray diffraction measurement and conducting a Rietveld analysis on both the crystal phase of the AlON crystal, the AlON solid solution crystal, or the inorganic crystal having the crystal structure identical to the AlON crystal and other crystal phases than the above-mentioned crystal phase. In a simplified way, the ratio of the content can be obtained from a ratio of intensities of the highest peaks of the respective phases of the crystal phase of the AlON crystal, the AlON solid solution crystal, or the inorganic crystal having the crystal structure identical to the AlON crystal and the other crystal phases.

The other crystal phase or the amorphous phase may comprise inorganic substance having electrical conductivity. In the VFD, FED or the like, if the phosphor of the present invention is excited by the electron beam, it is preferable that the phosphor has the electric conductivity to some extent since electrons are not accumulated on the phosphor, but are released outside. The inorganic substance having the electrical conductivity could be an oxide, an oxynitride, a nitride, or a combination thereof, which includes one or two or more kinds of elements selected from Zn, Ga, In, and Sn. In particular, indium oxide and indium tin oxide (ITO) are preferable since the fluorescence intensity is hardly lowered and the electric conductivity is high.

While the phosphor of the present invention emits green light, if it is necessary to mix the green light with other color light such as yellow light and red light, another inorganic phosphor which emits the other color light may be mixed with the phosphor of the present invention. While the other inorganic phosphor includes an inorganic phosphor that has a host crystal constituted of a fluoride, an oxide, an oxyfluoride, a sulfide, an oxysulfide, an oxynitride, or a nitride crystal, etc., if the thus-mixed phosphor is required to have durability, the inorganic phosphor may include the oxynitride crystal or the nitride crystal as the host crystal. The phosphor including, as the host crystal, the oxynitride and the nitride crystal may comprise a yellow phosphor of an α-sialon:Eu, a blue phosphor of an α-sialon:Ce, a red phosphor of $CaAlSiN_3$:Eu and $(Ca, Sr)AlSiN_3$:Eu (phosphor in which Ca of a $CaAlSiN_3$ crystal is partially substituted by Sr), a blue phosphor $((LaAl(Si_{6-z}Al_z) N_{10-z}O_z)$:Ce) having a JEM phase as a host, a blue phosphor of $La_3Si_8N_{11}O_4$:Ce, a blue phosphor of AlN:Eu, and so on.

As the backlight LED for the image display device, a red phosphor emitting light having a peak at a wavelength in a range of 620 nm or longer and 670 nm or shorter may be added, in addition to the phosphor of the present invention. As such a phosphor, a $Mn^{4+}$ activated phosphor may be utilized. The $Mn^{4+}$ activated phosphor is, preferably, $K_2SiF_6$:Mn (KSF), KSNAF ($K_2Si_{1-x}Na_xAl_xF_6$:Mn) where constituent elements of KSF are partially (preferably, 10 mole % or less) substituted by Al and Na, $K_2TiF_6$:Mn (KTF), and so on.

Phosphors of the present invention have different excitation spectra and different fluorescence spectra, respectively, depending on compositions thereof, and it is possible to design phosphors having various emission spectra by selecting and combining them as appropriate. A phosphor having a necessary emission spectrum may be designed on the basis of the application.

While the method of manufacturing the phosphor of the present invention is not limited in particular, the following method will be described as an example.

A raw material including Mn, a raw material including aluminum, and a raw material including the A element (where the A element is a monovalent metal element) are prepared. The raw material including Mn is selected from a group consisting of a metal of Mn, an oxide of Mn, a carbonate of Mn, a nitride of Mn, a fluoride of Mn, a chloride of Mn, an oxynitride of Mn, and a combination of the above-mentioned substances. The raw material containing aluminum is selected from a group consisting of aluminum metal, an aluminum oxide, an aluminum nitride, and an organic precursor containing aluminum, but a mixture of an aluminum nitride (AlN) and an aluminum oxide ($Al_2O_3$)

may be used. These materials have high reactivity and can be obtained as a synthesized compound of high purity, and further have the advantage that they are readily available because the materials are produced as industrial raw materials. The amounts of the aluminum nitride and the aluminum oxide may be calculated and designed based on the ratio of oxygen and nitrogen of the target AlON composition. The raw material including the A element is a nitride of A, a carbonate of A, a fluoride of A, and the like. In the case where the A element is lithium, in particular, the raw material including the A element is selected from a group consisting of a lithium nitride, a lithium carbonate, and a lithium fluoride.

Furthermore, if necessary, a raw material including the D element (where the D element is an element other than Mn, the A element, Al, O, and N) may be added thereto. The raw material including the D element is selected from a group consisting of a metal of the D element, an oxide of the D element, a carbonate of the D element, a nitride of the D element, a fluoride of the D element, a chloride of the D element, an oxynitride of the D element, and a combination of the above-mentioned substances. The D element is, for example, a divalent metal element.

Furthermore, in the case of obtaining the AlON solid solution crystal, a metal, an oxide, a carbonate, a nitride, a fluoride, a chloride, and an oxynitride including a solid-solution element, or a combination of the above-mentioned substances may be further added thereto if necessary.

A raw material mixture prepared by mixing these raw materials is filled in a container in a state where a filling rate thereof is maintained to a relative bulk density of 40% or less. The mixture is then fired in a nitrogen atmosphere of 0.2 atm or higher and 100 atm or lower in a temperature range of 1500° C. or higher and 2400° C. or lower. In this way, the phosphor of the present invention that includes the inorganic compound in which the AlON crystal, the AlON solid solution crystal, or the inorganic crystal having the crystal structure identical to that of the AlON crystal including at least Mn and the A element may be manufactured.

The optimum firing temperature may vary according to the composition, so that it can be optimized for each composition as appropriate. Typically, the firing is preferably performed in the temperature range of 1700° C. or higher and 2100° C. or lower. Thus, the phosphor of high brightness is obtained. If the firing temperature is lower than 1700° C., a generation rate of the AlON crystal, the AlON solid solution crystal, or the inorganic crystal having the crystal structure identical to that of the AlON crystal may be too low. If the firing temperature exceeds 2100° C., a special device is required, which is industrially undesirable.

In order to improve reactivity during the firing process, an inorganic compound which forms a liquid phase at the firing temperature or a temperature below the firing temperature may be added to the raw material mixture if necessary. An inorganic compound which forms a stable liquid phase at a reaction temperature is preferable for the inorganic compound and a fluoride, a chloride, an iodide, a bromide, or a phosphate of Li, Na, K, Mg, Ca, Sr, Ba, or Al is suitable. Furthermore, not only the inorganic compound of one kind may be added by itself, but also two or more kinds of inorganic compounds may be mixed and added. In particular, magnesium fluoride, aluminum fluoride, and lithium fluoride are preferable because they improve reactivity for synthesis. Although the additive amount of the inorganic compound is not specifically limited, a range of 0.1 weight parts or more and 10 weight parts or less to 100 weight parts of the raw material mixture is preferable for improving the reactivity. The additive amount less than 0.1 weight parts may not provide so much improvement of the reactivity, and the additive amount exceeding 10 weight parts may cause the brightness of the phosphor to be lowered. If these inorganic compounds are added to the raw material mixture and then the mixture is fired, the reactivity of the mixture is improved such that a particle growth may be promoted in a relatively short time so as to yield a single crystal having a large particle diameter such that the brightness of the phosphor is improved.

The nitrogen atmosphere may be a gas atmosphere in a pressure range of 0.2 atm or more and 100 atm or less. If it is heated at temperature of 2400° C. or higher in a nitrogen gas atmosphere less than 0.2 atm, the raw material tends to be subject to pyrolysis, which is not so much preferable. If it exceeds 100 atm, special equipment is required such that it is not industrially suitable.

When fine powder of a particle diameter of several micrometers is employed as a starting material, the mixture of raw material after completion of the mixing process exhibits morphology in which the fine powder of the particle diameter of several micrometers aggregates to a size of several hundreds of micrometers to several millimeters (hereinafter called "powder aggregate"). In the present invention, the powder aggregate is fired in a state with the filling rate maintained in a bulk density that does not exceed 40%. Further, it is preferable that the bulk density does not exceed 20%. Here, the term of relative bulk density means the ratio of a value (bulk density) given by dividing the mass of powder material filled in the container by the capacity of the container to a value of the real density of the substance of the powder material. In a typical sialon production, a hot pressing method in which heating is conducted as it is pressurized or a manufacturing method of firing after die molding (powder compacting) is employed, and hence the firing process is conducted in a state where the powder filling rate is high. In the present invention, however, the powder aggregate of the raw material mixture in which the particle size is made rather uniform is charged into a container or the like as it is with a filling rate of a bulk density that does not exceed 40% without applying any mechanical force to the powder or without molding the powder with a die in advance. If necessary, the powder aggregate may be subject to particle size control by granulating it to an average particle diameter that does not exceed 500 µm by using a sieve or an air classifier. Also, the powder aggregate may be granulated directly into a shape size of an averaged particle diameter of 500 µm or smaller by using a spray dryer and the like. A container of boron nitride has an advantage of little reactivity with the phosphor.

The reason why the firing process is performed while the bulk density is maintained not to exceed 40% is to fire the raw material powder while a free space is maintained around the raw material powder. The optimal bulk density depends on the shapes and surface conditions of the granulated particles, but it is typically preferable for it not to exceed 20%. In this way, crystals of reaction products grow in a free space, so that it is likely that the crystals have smaller chance to come into contact with each other, whereby crystals with a smaller number of surface defects are considered to be synthesized. Therefore, a high-brightness phosphor may be obtained. When the bulk density exceeds 40%, partial densification takes place during the firing so that a dense sintered body appears, which hinders crystal growth. As a result, the brightness of the phosphor may be reduced. And powder products with fine particles are unlikely to be obtained. The powder aggregate having an average particle size of 500 µm or smaller is particularly preferable to achieve excellent grindability after the firing.

Then, the powder aggregate having a filling rate of 40% or smaller is fired under the above condition. The furnace used for firing may be heated by metal resistance heating or graphite resistance heating because the firing temperature is high and nitrogen is employed as the firing atmosphere. An electric furnace in which carbon is used for the material in a hot section of the furnace is preferable. As for firing, a sintering method in which no mechanical pressure is applied from the outside, such as normal pressure sintering and gas pressure sintering, is desirable for performing firing while maintaining the bulk density in a predetermined range.

When the powder aggregate obtained by firing is solidified hard, the aggregate is ground by using a mill usually employed in the factory, such as a ball mill, jet mill, and the like. Among them, the particle size is controlled most easily in ball milling. At this time, balls and a pot to be used are preferably made of sintered silicon nitride, sintered sialon, or the like. Grinding is continued until an averaged particle diameter of 20 µm or smaller is reached. A particularly desirable averaged particle diameter is 5 µm or larger and 20 µm or smaller. When the averaged particle diameter exceeds 20 µm, the fluidity of the powder and dispersion into resin deteriorate, and the emission intensity may become nonuniform from part to part when a light emitting device is built by combining the phosphor with a light-emitting element. When the averaged particle diameter does not exceed 5 µm, the emission efficiency of the phosphor may be lowered. If an objective particle diameter is not achieved by grinding alone, classification may be used in combination with the grinding. Sieving, air classification, and settling in a liquid may be employed as means of classification.

Further, by washing the fired product with a solvent for dissolving these inorganic compounds after the firing, the contents of the inorganic compounds such as glass phases, a second phase, or impurity phases other than the phosphor contained in the reaction product is reduced so that the brightness of the phosphor is improved. As such a solvent, water and aqueous solution of an acid can be used. As the aqueous solution of the acid, sulfuric acid, hydrochloric acid, nitric acid, hydrofluoric acid, a mixture of organic acid and hydrofluoric acid, or the like can be used. In particular, the mixture of sulfuric acid and hydrofluoric acid has a great effect. This processing is quite effective with respect to a reaction product fired at a high temperature wherein the inorganic compounds yielding a liquid phase at the firing temperature or lower have been added to the raw material mixture in advance.

In the way described above, fine phosphor powder is obtained, but the heat treatment is effective in order to improve the brightness. In this case, the powder after firing or the powder after particle size adjustment by pulverization and classification may only have to be subject to heat treatment at a temperature that is 1000° C. or higher and is equal to or lower than the firing temperature. The heat treatment at a temperature lower than 1000° C. is not so much effective in removing surface defects. The heat treatment at a temperature equal to or higher than the firing temperature is not preferable because pulverized powders aggregate again with each other. The atmosphere suitable for the heat treatment depends on the phosphor composition, but a mixture atmosphere of one or two or more kinds of gases selected from a group consisting of nitrogen, air, ammonia, and hydrogen can be used and a nitrogen atmosphere is preferable because it is excellent in removing defects.

The phosphor of the present invention obtained in the way as described above is characterized by high brightness of a visible light emission as compared with an ordinary oxide phosphor and an existing AlON phosphor. In particular, a phosphor having a specific composition is characterized by green light, emission and is suitable for an illuminating device and an image display device. In addition, the phosphor of the present invention does not deteriorated even if it is exposed to a high temperature such that it is excellent in the heat resistance and the long-term stability under an oxidizing atmosphere and a moisture environment.

The illuminating device of the present invention includes at least an emission source that emits light having a wavelength of 410 nm or longer and 460 nm or shorter, and a phosphor or a light transmitting body in which the phosphor is dispersed. Here, the phosphor includes the above-described phosphor of the present invention.

As the illuminating device, an LED illuminating device, an LD (laser diode) illuminating device, and the like are included. The LED illuminating device may be manufactured, using the phosphor of the present invention, by a known method disclosed in Japanese Unexamined Patent Application Publication No. H05(1993)-152609, Japanese Unexamined Patent Application Publication No. H07 (1995)-99345, Japanese Patent No. 2927279, for example. In this case, it is desirable that the emission source is what emits light having the wavelength of 410 nm or longer and 460 nm or shorter, and in particular it is preferably an LED light emitting element or an LD light emitting element that emits light having a peak at a wavelength in a range of 430 nm or longer and 460 nm or shorter. Further preferably, the emission source is an LED light emitting element or an LD light emitting element that emits light having a peak at a wavelength in a range of 440 nm or longer and 449 nm or shorter. Use of the emission source having such wavelength ensures the light emission with the high brightness of the phosphor of the present invention. Here, as such a light-emitting element, an element comprising a nitride semiconductor such as GaN and InGaN is included and could be an emission source to emit light having a predetermined wavelength by adjusting a composition thereof.

An illuminating device which emits light of a desired color can be configured by using another phosphor having other emission characteristics in combination with the phosphor of the present invention other than by using only the phosphor of the present invention alone in the illuminating device. For example, there is a combination of a blue LED or LD light emitting element of 445 nm, a yellow phosphor excited by the light of the wavelength and then exhibiting an emission peak at a wavelength of 550 nm or longer and 600 nm or shorter, and a green phosphor of the present invention. As such a yellow phosphor, an α-sialon:$Eu^{2+}$ disclosed in Japanese Unexamined Patent Application Publication No. 2002-363554 and $(Y, Gd)_2(Al, Ga)_5O_{12}$:Ce disclosed in Japanese Unexamined Patent Application Publication No. H09(1997)-218149 may be referred to. In such a configuration, irradiating the blue light emitted from the LED or the LD on the phosphors causes the phosphors to emit green light and yellow light, respectively, and mixing the blue light and the light from the phosphors causes the illuminating device to emit light of white color.

As another example, there is a combination of a blue LED or LD light emitting element of light of 445 nm, a red phosphor being excited by the light of the wavelength and emitting light having an emission peak at a wavelength of 620 nm or longer and 700 nm or shorter, and a green phosphor of the present invention. Such a red phosphor includes CaSiAlN$_3$:Eu$^{2+}$ disclosed in International Publication No. 2005/052087 and a Mn$^{4+}$ activated phosphor. The Mn$^{4+}$ activated phosphor is specifically K$_2$SiF$_6$:Mn (KSF) or K$_2$Si$_{1-x}$Na$_x$Al$_x$F$_6$:Mn (KSNAF) in which the constituent elements of KSF are partially (preferably, 10 mole % or less) substituted by Al and Na. In such a configuration, irradiating the blue light emitted by the LED or the LD on the phosphors causes the phosphors to emit red light and green light, respectively, and mixing the blue light and the light from the phosphors causes the illuminating device to emit light of white color.

The light transmitting body in which the phosphor including at least the phosphor of the present invention is dispersed is selected from a group consisting of acrylic resin, silicone resin, and glass. These materials have excellent translucency to the above-described light from the emission source, thereby allowing the phosphor of the present invention to be excited quite efficiently.

And a proportion of the phosphor in the light transmitting body in which the phosphor including at least the phosphor of the present invention is dispersed is preferably in a range of 30 volume % or more and 90 volume % or less. In this way, the phosphor of the present invention can be allowed to be excited quite efficiently.

The image display device of the present invention includes at least an excitation source and a phosphor, and here, the phosphor includes at least the above-described phosphor of the present invention. The image display device includes a fluorescent display tube (VFD), a field emission display (FED or SED), a plasma display panel (PDP), a cathode-ray tube (CRT), and so on. It has been confirmed that the phosphor of the present invention emits light by excitation of a vacuum ultraviolet ray of 100 to 190 nm, an ultraviolet ray of 190 to 380 nm, an electron beam, or the like, and the above-described image display devices can be configured by combining these excitation sources and the phosphor of the present invention.

Since the phosphor of the present application is efficiently excited and excellent in the excitation by the electron beam, it is suitable for the application to VFD, SED, PDP, and CRT, in which the acceleration voltage of the electron beam is 10 V or higher and 30 kV or lower. The FED is an image display device in which luminescence is produced by bombarding the phosphor applied on the anode with electrons emitted and accelerated from the field emission cathode and it is required that the luminescence be made with an acceleration voltage not exceeding 5 kV so that the display device will be improved in the luminescence performance by combining the phosphor of the present invention.

Then, the present invention will be explained in more detail with examples to be shown below, but these examples are disclosed only to facilitate the understanding of the present invention with ease and it should be understood that the present invention is not limited to these examples.

EXAMPLES

Examples 1 to 10 and Comparative Example 11

As raw material powders, aluminum nitride powder (manufactured by Tokuyama Corporation, F grade) with a specific surface area of 3.3 m$^2$/g and an oxygen content of 0.79%, aluminum oxide powder (manufactured by TAIMEI CHEMICALS CO., LTD., Taimicron grade) with a specific surface area of 13.6 m$^2$/g and a purity of 99.99%, lithium carbonate powder (manufactured by Kojundo Chemical Lab. Co., reagent grade) with a purity of 99.99%, manganese carbonate powder (manufactured by Kojundo Chemical Lab. Co., reagent grade) with a purity of 99.9%, and magnesium oxide (manufactured by Kojundo Chemical Lab. Co., reagent grade) with a purity of 99.99% were used.

An inorganic compound in which AlON contains at least Mn and the A element (where the A element is Li) and the D element if necessary (where the D element is Mg) was synthesized. Table 1 shows design compositions of examples and a comparative example 1 to 11. In order to obtain the inorganic compounds represented by a design composition formula Mn$_a$A$_b$Al$_c$O$_d$N$_e$D$_f$ (a+b+c+d+e+f=1) as shown in Table 1, the raw material powders were weighted with mass ratios as shown in Table 2.

TABLE 1

List of design composition parameters in Examples and Comparative example 1 to 11
Parameters values MnaAbAlcOdNeDf

| | a | b | c | d | e | f |
|---|---|---|---|---|---|---|
| Example 1 | 0.00496 | 0.00248 | 0.408978 | 0.511409 | 0.072173 | 0 |
| Example 2 | 0.004993 | 0.004993 | 0.407389 | 0.510734 | 0.071892 | 0 |
| Example 3 | 0.005092 | 0.012729 | 0.402495 | 0.508656 | 0.071029 | 0 |
| Example 4 | 0.027548 | 0.027548 | 0.374656 | 0.504132 | 0.066116 | 0 |
| Example 5 | 0.093458 | 0.031153 | 0.317757 | 0.501558 | 0.056075 | 0 |
| Example 6 | 0.004623 | 0.023116 | 0.3865 | 0.565418 | 0.020342 | 0 |
| Example 7 | 0.004769 | 0.023844 | 0.388174 | 0.551741 | 0.031474 | 0 |
| Example 8 | 0.004924 | 0.024618 | 0.389956 | 0.537174 | 0.043328 | 0 |
| Example 9 | 0.005089 | 0.025445 | 0.391858 | 0.521628 | 0.05598 | 0 |
| Example 10 | 0.005416 | 0.027078 | 0.382074 | 0.504468 | 0.067425 | 0.013539 |
| Comparative example 11 | 0.015941 | 0 | 0.379384 | 0.511158 | 0.06695 | 0.026568 |

TABLE 2

List of mixture compositions of raw material powder (mass %) in Examples and Comparative example 1 to 11
Mixture compositions of raw material powder (mass %)

| | AlN | Al2O3 | LiCO3 | MnCO3 | MgO |
|---|---|---|---|---|---|
| Example 1 | 14.23 | 82.59 | 0.44 | 2.74 | 0 |
| Example 2 | 14.16 | 82.2 | 0.89 | 2.76 | 0 |
| Example 3 | 13.95 | 80.99 | 2.25 | 2.81 | 0 |
| Example 4 | 11.98 | 69.53 | 4.5 | 14 | 0 |
| Example 5 | 8.35 | 48.45 | 4.18 | 39.02 | 0 |
| Example 6 | 3.99 | 89.37 | 4.09 | 2.54 | 0 |
| Example 7 | 6.17 | 86.99 | 4.21 | 2.62 | 0 |
| Example 8 | 8.49 | 84.46 | 4.35 | 2.7 | 0 |
| Example 9 | 10.96 | 81.76 | 4.49 | 2.79 | 0 |

TABLE 2-continued

List of mixture compositions of raw material powder
(mass %) in Examples and Comparative example 1 to 11
Mixture compositions of raw material powder (mass %)

|  | AlN | Al2O3 | LiCO3 | MnCO3 | MgO |
|---|---|---|---|---|---|
| Example 10 | 13.18 | 76.48 | 4.77 | 2.97 | 2.6 |
| Comparative example 11 | 13.15 | 76.31 | 0 | 5.42 | 5.13 |

The weighted raw material powders were mixed using a mortar and a pestle made of silicon nitride sintered body, and subsequently, passed through a sieve having openings of 125 μm, thus obtaining a powder aggregate having an excellent fluidity. Free-falling the powder aggregate into a crucible made of boron nitride having a size of 20 mm in the diameter and 20 mm in the height caused the bulk density of 15 to 30 volume %. The bulk density was calculated based on a weight of the fallen powder aggregate, an inner volume of the crucible, and a true density of the powder.

Next, the crucible was set into an electric furnace of a graphite resistive heating type. In the firing operation, first, a diffusion pump was used to make a firing atmosphere vacuum, heating was performed from a room temperature to 800° C. at a speed of 500° C. per hour, nitrogen having the purity of 99.9995 volume % was introduced at 800° C. to make a gas pressure 10 atm, the temperature was raised to 1700° C. at 500° C. per hour, and then, the temperature was raised to 1800° C. at 24° C. per hour and was kept at 1800° C. for 10 minutes. The synthesized sample was milled using the mortar and the pestle made of silicon nitride.

ICP elemental analysis was performed on the synthesized sample. As the result, it was confirmed that the samples of Examples 1 to 9 included Al, N, Li, Mn, and O, and the sample of Example 10 included Al, N, Li, Mn, Mg, and O. Furthermore, the powder X-ray diffraction measurement (XRD) using Cu Kα line was performed on the synthesized samples. The result is shown in FIG. 1.

FIG. 1 is a diagram showing a XRD pattern of the inorganic compound of Example 1.

According to FIG. 1, a crystal having a γ-type AlON structure and a second phase constituted of aluminum oxide or aluminum nitride were confirmed. Based on height ratios of main peaks, it was determined that a production ratio of the crystal having the γ-type AlON structure was at least 90%. Here, a peak indicating a compound of Li was not detected. Similar results were derived from the XRD patterns of the other examples.

From the aforementioned, it was confirmed that the samples obtained from the Examples had the inorganic compound that included the AlON crystal including Mn and Li, and further Mg as the main component, and especially, it was found that Mn, Li, and further Mg were solid solved in the AlON crystal.

Next, it was confirmed that the inorganic compound obtained in this way emitted green light, as a result, after it was irradiated by a lamp emitting light of the wavelength of 365 nm. From this, it was shown that the samples obtained from the Examples were the phosphors that had, as the main component, the inorganic compounds including the AlON crystal including Mn and Li, and further Mg, and emitted light of green color.

Figure 2:
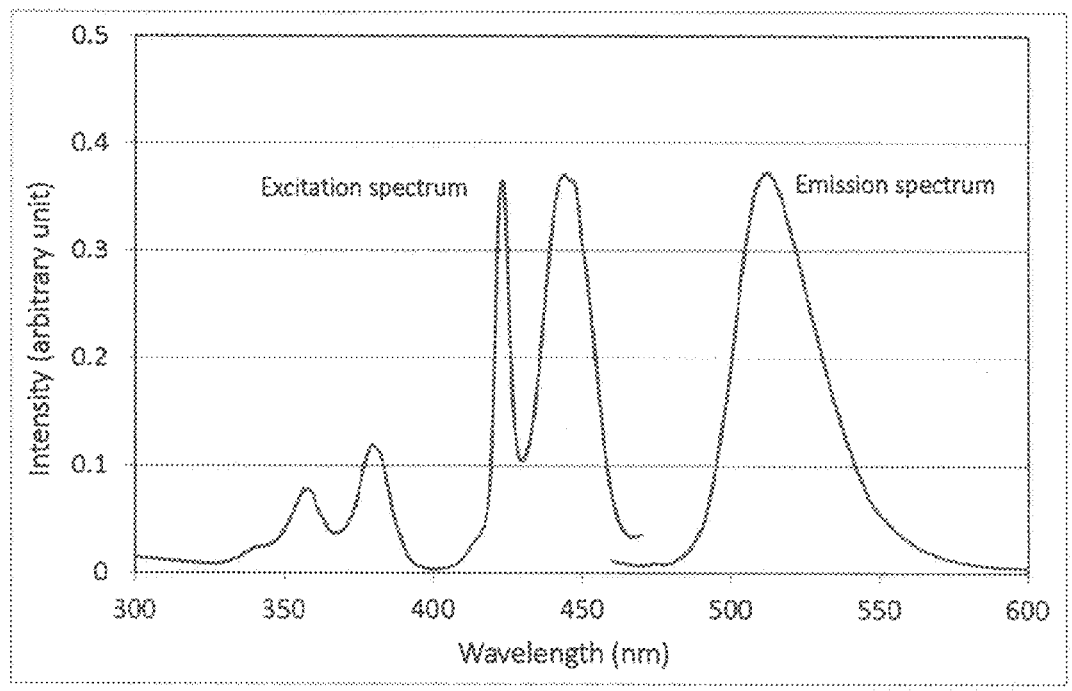
FIG. 2 is a diagram showing an excitation spectrum and an emission spectrum of the inorganic compound of Example 1.

Next, the emission spectra and the excitation spectra of the inorganic compounds obtained from the Examples and the Comparative example 1 to 11 were measured with a spectrophotofluorometer. The results are shown in FIG. 2 and Table 3. Table 3 shows peak wavelengths at which maximum values of the excitation spectra were measured and peak wavelengths at which maximum values of the emission spectra were measured.

FIG. 2 is a diagram showing an excitation spectrum and an emission spectrum of the inorganic compound of Example 1.

TABLE 3

List of Excitation wavelength and emission wavelength
in Examples and Comparative example 1 to 11
Excitation and emission characteristics

|  | Excitation wavelength (nm) | Emission peak wavelength (nm) | Emission intensity (arbitrary unit) |
|---|---|---|---|
| Example 1 | 444 | 513 | 0.37 |
| Example 2 | 423 | 511 | 0.39 |
| Example 3 | 423 | 512 | 0.37 |
| Example 4 | 424 | 511 | 0.25 |
| Example 5 | 423 | 516 | 0.5 |
| Example 6 | 423 | 512 | 0.7 |
| Example 7 | 423 | 511 | 0.53 |
| Example 8 | 424 | 511 | 0.35 |
| Example 9 | 424 | 511 | 0.3 |
| Example 10 | 424 | 511 | 0.24 |
| Comparative example 11 | 445 | 512 | 0.15 |

FIG. 2 shows an emission spectrum in the case where it was excited by light of the wavelength of 445 nm and an excitation spectrum in the case where the emission wavelength was fixed to 513 nm. According to Table 3, it was found that the inorganic compound of Example 1 was most efficiently excited by the light of 444 nm and emitted green light having a peak at the wavelength of 513 nm. It was found that the inorganic compounds of Examples 1 to 10 were the phosphors, each of which exhibited a peak of an excitation spectrum at a wavelength in a range of 420 nm or longer and 449 nm or shorter and emitted light having a peak of an emission spectrum at a wavelength in a range of 510 nm or longer and 530 nm or shorter upon excitation by light having the peak wavelength of the excitation spectrum. Since the emission intensities (count values) of the excitation spectrum and the emission spectrum vary depending on the measurement device and the measurement condition, the unit is an arbitrary unit. That is, the comparison is allowed only in the present Examples measured under the identical condition.

Also it was confirmed that the emission characteristics were improved by making the AlON crystal contain Li from the comparison of Examples 1 to 10 with Comparative example 11.

The emission characteristics (cathodoluminescence, CL) upon electron beam irradiation were observed by SEM equipped with a CL detector, and CL images were evaluated. As a result, it was confirmed that any inorganic compound of any of the Examples was excited by the electron beam and emitted light of green color.

Next, an illuminating device utilizing the phosphor of the present invention will be explained.

Figure 3:
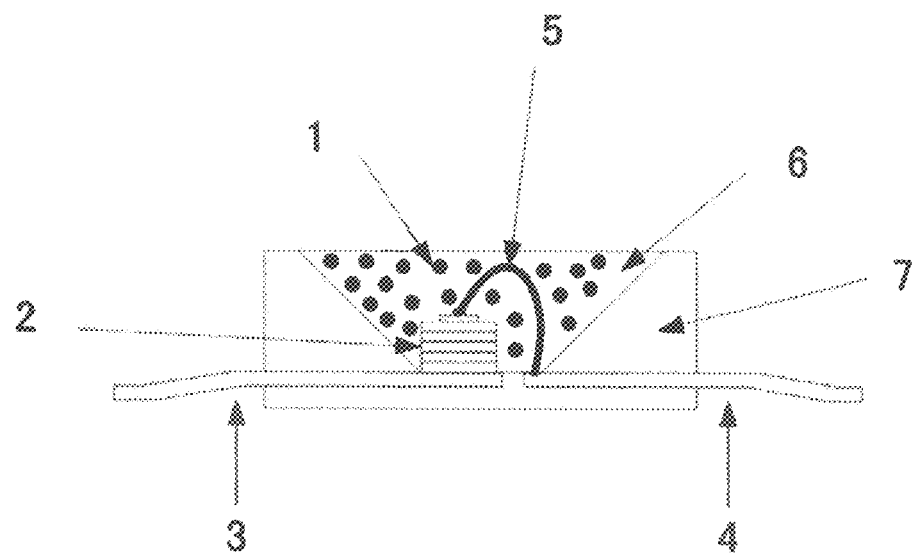
FIG. 3 is a schematic structure diagram showing an illuminating device (LED illuminating device) according to the present invention.

FIG. 3 shows a diagram illustrating a schematic structure diagram of the illuminating device (a white LED illuminating device) of the present invention.

The white LED of the present invention includes a phosphor mixture 1 that includes the phosphor of the present invention and another phosphor, and an emission source 2. Here, the phosphor mixture 1 is a mixture of the green phosphor manufactured in Example 1 of the present invention and the red phosphor of CaAlSiN$_3$:Eu. Here, the emission source 2 is a light emitting element constituted of a blue LED chip of 445 nm. The phosphor mixture 1 is dispersed in a resin layer 6, configured to cover the blue LED chip 2, and disposed in a container 7.

When current is supplied to conductive terminals 3 and 4, the current is provided to the blue LED chip 2 through a wire bond 5, light of 445 nm is emitted, and the light excites the phosphor mixture 1 of the green phosphor and the red phosphor, thereby allowing light of green color and light of red color to be emitted, respectively. Mixing the green light, the red light, and the blue light emitted from the blue LED chip 2 allows the illuminating device to emit light of white color and perform its function.

The illuminating device is configured by utilizing the green phosphor manufactured in Example 1 and K$_2$SiF$_6$:Mn red phosphor as the phosphor mixture 1 as shown in FIG. 3. In this case again, in the illuminating device of the present invention, the light of 445 nm emitted by the blue LED chip 2 excites the phosphor mixture 1 of the green phosphor and the red phosphor, thereby allowing the green phosphor and the red phosphor to emit light of green color and light of red color, respectively. Mixing the green light, the red light, and the blue light emitted from the blue LED chip 2 allows the illuminating device to emit light of white color and perform its function.

Figure 4:
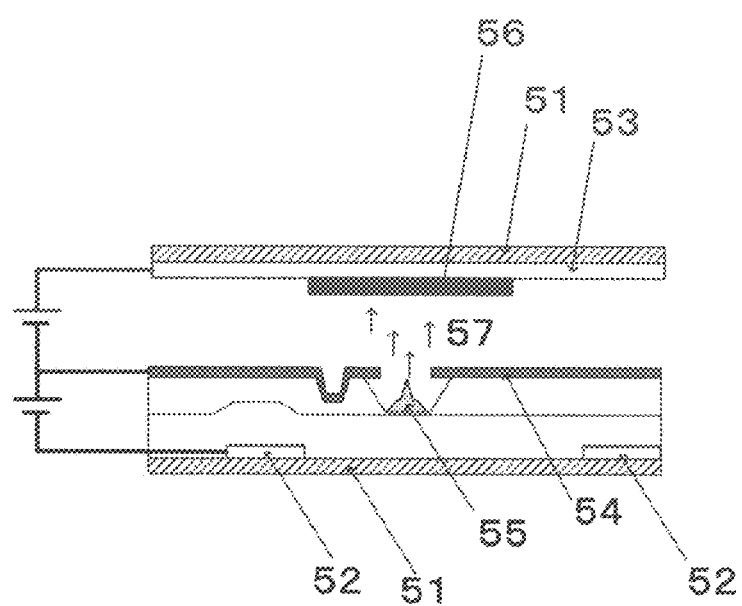
FIG. 4 is a schematic structure diagram showing an image display device (field emission display panel) according to the present invention.

Next, an image display device utilizing the phosphor of the present invention will be explained FIG. 4 shows a schematic structure diagram of the image display device (a field emission display panel) of the present invention.

The image display device of the present invention includes at least an emitter 55 as an excitation source and a green phosphor 56 manufactured in Example 1. The green phosphor 56 is applied to an interior surface of an anode 53. When a voltage is applied between a cathode 52 and a gate 54, electrons 57 are emitted from the emitter 55. The electrons 57 are accelerated by the voltage of the anode 53 and the cathode 52 so as to collide against the green phosphor 56, thereby allowing the green phosphor 56 to emit light of green color. The entire image display device of the present invention is protected by glass 51. While the drawing illustrates one light-emitting cell constituted of one emitter and one phosphor, a display is actually configured to emit light of a variety of color by arranging many cells for a blue color and a red color in addition to one for the green color. While the phosphor used for the blue and red cells are not particularly specified, a phosphor that emits light of high brightness with a low speed electron beam may be employed.

INDUSTRIAL APPLICABILITY

The phosphor of the present invention exhibits green color emission with high color purity, and shows little degradation in brightness of fluorescence in the case of being exposed to the excitation source such that it is suitably utilized for the VFD, the FED, the PDP, the CRT, the white LED, and the like. In the future, it is expected that the phosphor of the present invention will be extensively utilized in the backlight LED and various kinds of display devices with an electron beam excitation, thereby contributing to the development of the industry.

EXPLANATION OF NUMERALS 1 phosphor mixture of red phosphor and phosphor of the present invention, 2 blue LED chip,
3, 4 electrically conductive terminal,
5 wire bond,
6 resin layer,
7 container,
51 glass,
52 cathode,
53 anode,
54 gate,
55 emitter,
56 phosphor of the present invention,
57 electrons,

What is claimed is:

1. A phosphor comprising: an inorganic compound in which an AlON crystal, an AlON solid solution crystal, or an inorganic crystal having a crystal structure identical to the AlON crystal includes at least Mn and an A element (where the A element is a monovalent metal element) and further includes a D element (where the D element is an element other than Mn, the A element, Al, O, and N) if necessary, wherein the phosphor emits fluorescence having a peak at a wavelength in a range of 490 nm or longer and 550 nm or shorter upon irradiation of the excitation source.

2. The phosphor according to claim 1, wherein Mn and the A element, and the D element if necessary, are solid solved into the AlON crystal, the AlON solid solution crystal, or the inorganic crystal having the crystal structure identical to the AlON crystal.

3. The phosphor according to claim 1, wherein the phosphor is represented by a composition formula: $Mn_a A_b Al_c O_d N_e D_f$ (where a+b+c+d+e+f=1 in the formula), and the parameters a, b, c, d, e, and f satisfy:

$0.0003 \leq a \leq 0.10$, $0.002 \leq b \leq 0.24$, $0.25 \leq c \leq 0.45$, $0.42 \leq d \leq 0.58$, $0.02 \leq e \leq 0.13$, and $0 \leq f \leq 0.10$.

4. The phosphor according to claim 3, wherein the parameters a, b, c, d, e, and f satisfy:

$0.004 \leq a \leq 0.10$, $0.002 \leq b \leq 0.032$, $0.31 \leq c \leq 0.41$, $0.5 \leq d \leq 0.57$, $0.02 \leq e \leq 0.075$, and $0 \leq f \leq 0.02$.

5. The phosphor according to claim 1, wherein the A element is Li.

6. The phosphor according to claim 1, wherein the D element is Mg.

7. The phosphor according to claim 3, wherein the D element is partially or entirely constituted of Mg and a parameter value $f_1$ (atomic fraction) indicating a content of the Mg satisfies $0.001 \leq f_1 \leq 0.09$.

8. The phosphor according to claim 3, wherein the D element is partially or entirely constituted of F and a parameter value $f_2$ (atomic fraction) indicating a content of the F satisfies $0.0001 \leq f_2 \leq 0.05$.

9. The phosphor according to claim 1, wherein fluorescence having a peak at a wavelength in a range of 510 nm or longer and 530 nm or shorter is emitted upon irradiation of excitation light having a wavelength of 430 nm or longer and 460 nm or shorter.

10. An illuminating device comprising: at least an emission source that emits light having a wavelength of 410 nm or longer and 460 nm or shorter and a phosphor or a light transmitting body in which the phosphor is dispersed,
wherein the phosphor comprises the phosphor recited in claim 1.

11. The illuminating device according to claim 10, wherein the emission source is an LED (light-emitting diode) or an LD (laser diode) that emits light having a peak at a wavelength in a range of 430 nm or longer and 460 nm or shorter.

12. The illuminating device according to claim 11, wherein the emission source may be an LED (light-emitting diode) or an LD (laser diode) that emits light having a peak at a wavelength in a range of 440 nm or longer and 449 nm or shorter.

13. The illuminating device according to claim 10, wherein the phosphor further comprises a red phosphor to emit light having a peak at a wavelength in a range of 620 nm or longer and 670 nm or shorter.

14. The illuminating device according to claim 13, wherein the red phosphor is a phosphor activated by $Mn^{4+}$.

15. The illuminating device according to claim 14, wherein the red phosphor is $K_2SiF_6$:Mn and/or $K_2Si_{1-x}Na_xAl_xF_6$:Mn, where $0 < x \leq 0.1$.

16. The illuminating device according to claim 10, wherein, in a light transmitting body in which the phosphor is dispersed, a proportion of the phosphor in the light transmitting body is 30 volume % or more and 90 volume % or less.

17. The illuminating device according to claim 10, wherein the light transmitting body is selected from a group constituted of acrylic resin, silicone resin, and glass.

18. An image display device comprising: at least an excitation source and a phosphor,
wherein the phosphor comprises the phosphor recited in claim 1.

19. A method of manufacturing a phosphor recited in claim 1 comprises:
mixing, at least $Al_2O_3$, AlN, a raw material including Mn and a raw material including an A element (where the A element is a monovalent metal element), and, if necessary, a raw material including a D element (where the D element is an element other than Mn, the A element, Al, O, and N), and
firing thus-mixed materials in a nitrogen atmosphere in a range of 0.2 atm or higher and 100 atm or lower at a temperature in a range of 1500° C. or higher and 2400° C. or lower.

20. The method according to claim 19, wherein the A element is Li.

21. The method according to claim 19, wherein the D element is a divalent metal element.

* * * * *